US012593726B2

(12) United States Patent　(10) Patent No.:　US 12,593,726 B2
Karikalan et al.　(45) Date of Patent:　Mar. 31, 2026

(54) SEMICONDUCTOR PACKAGE WITH SIDE WALL INTERCONNECTION

(71) Applicant: Avago Technologies International Sales Pte. Limited, Singapore (SG)

(72) Inventors: Sam Karikalan, Ladera Ranch, CA (US); Sam Zhao, Irvine, CA (US); Mayank Mayukh, Fort Collins, CO (US); Liming Tsau, Irvine, CA (US); Dharmendra Saraswat, Foothill Ranch, CA (US); Arun Ramakrishnan, Lake Forest, CA (US); Reza Sharifi, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 903 days.

(21) Appl. No.: 17/876,504

(22) Filed: Jul. 28, 2022

(65) Prior Publication Data

US 2024/0038724 A1　Feb. 1, 2024

(51) Int. Cl.
　*H01L 25/065*　(2023.01)
　*H01L 23/00*　(2006.01)
　*H01L 23/498*　(2006.01)
　*H01L 25/00*　(2006.01)

(52) U.S. Cl.
　CPC .... *H01L 25/0657* (2013.01); *H01L 23/49816* (2013.01); *H01L 24/05* (2013.01); *H01L 24/08* (2013.01); *H01L 24/32* (2013.01); *H01L 25/50* (2013.01); *H01L 2224/05569* (2013.01); *H01L 2224/08225* (2013.01); *H01L 2224/32145* (2013.01)

(58) Field of Classification Search
　CPC ... H10B 80/00; H01L 23/49816; H01L 24/05; H01L 24/08; H01L 24/32; H01L 2224/05569; H01L 2224/08225; H01L 2224/32145; H01L 25/0657; H01L 25/50
　USPC ........................................................ 257/773
　See application file for complete search history.

(56) References Cited

U.S. PATENT DOCUMENTS

| | | | |
|---|---|---|---|
| 9,666,520 B2 | 5/2017 | Yu et al. | |
| 11,031,371 B2 * | 6/2021 | Chiu | H01L 25/50 |
| 11,217,560 B2 | 1/2022 | Shih et al. | |
| 11,222,865 B2 | 1/2022 | Periyannan et al. | |
| 2018/0114773 A1 * | 4/2018 | Chiu | H01L 25/50 |
| 2020/0411481 A1 | 12/2020 | Yang et al. | |
| 2021/0327853 A1 | 10/2021 | Zhao | |
| 2021/0358886 A1 | 11/2021 | Periyannan et al. | |

* cited by examiner

*Primary Examiner* — Jasmine J Clark
(74) *Attorney, Agent, or Firm* — Quarles & Brady LLP

(57)　ABSTRACT

Tools and techniques for a semiconductor package providing side wall interconnections are provided. An apparatus includes two or more die layers that are bonded together, the first 3D stacked die package comprising a top surface, bottom surface, and one or more side walls. A first side wall of the one or more side walls includes two or more side wall pads, wherein each side wall pad of the two or more side wall pads is coupled to an interconnect of a respective die layer of the two or more die layers.

20 Claims, 6 Drawing Sheets

200

215

220

225

230

210a

210b

210n

205

Form two or more die layers, each die layer including at least one side wall pad

605

Stack the two or more die layers

610

Bond the stack of the two or more die layers to form 3D stacked die package

615

Expose respective side wall pads of the two or more die layers at a side wall of the 3D stacked die package

620

Form one or more layers of RDL

625

Form additional interconnection layer

630

Bond a package element to the 3D stacked die package

635

600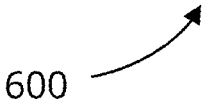

FIG. 6

SEMICONDUCTOR PACKAGE WITH SIDE WALL INTERCONNECTION

COPYRIGHT STATEMENT

FIELD

The present disclosure relates, in general, to methods, systems, and apparatuses for a semiconductor package including side wall interconnections.

BACKGROUND

Conventional interconnections between individual dies in a three-dimensional (3D) chip stack rely on through-silicon vias (TSVs) to provide physical and/or electrical connectivity between layers. This results in larger chip sizes due to keep-out zones around TSVs. In some instances, intellectual property (IP) cores on adjacent dies of a 3D stack may further be limited to where they may be placed in relation to each other, resulting in inefficient usage of space and larger chip footprints.

Thus, methods, systems, and apparatuses for a semiconductor package with side wall interconnection are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIG. 6 is a flow diagram of a method of manufacturing a 3D chip stack with side wall interconnection, in accordance with various embodiments.

DETAILED DESCRIPTION OF EMBODIMENTS

Figure 1:
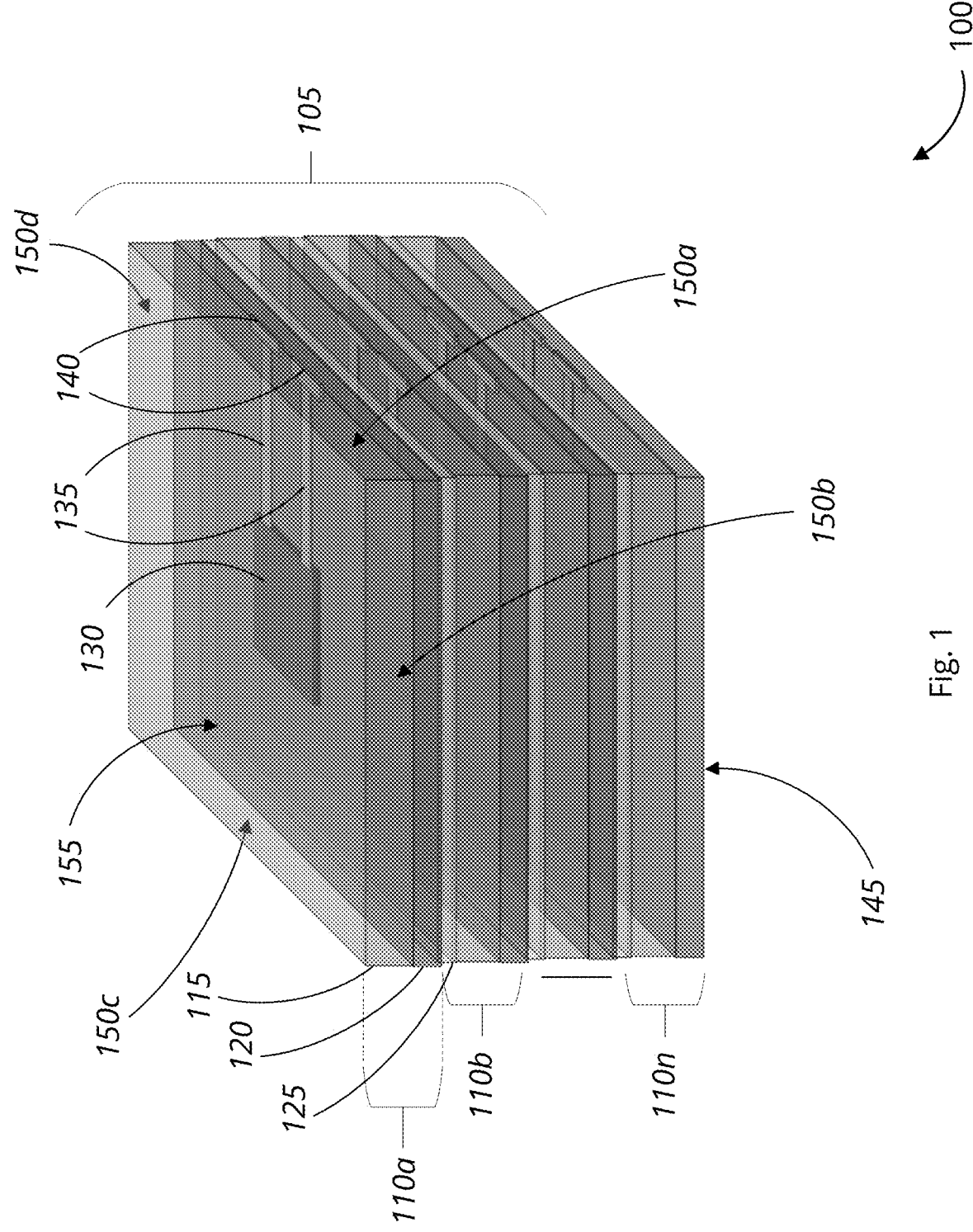
FIG. 1 is a schematic diagram of a semiconductor package for side wall interconnection with side wall pads, in accordance with various embodiments.

Various embodiments set forth a semiconductor package providing side wall interconnections, and methods of manufacturing a semiconductor package providing side wall interconnections.

In some embodiments, an apparatus for a semiconductor package with side wall interconnections is provided. The apparatus includes two or more die layers that are bonded together, two or more die layers comprising a top surface, bottom surface, and one or more side walls. A first side wall of the one or more side walls includes two or more side wall pads, wherein each side wall pad of the two or more side wall pads is coupled to an interconnect of a respective die layer of the two or more die layers.

In further embodiments, a semiconductor device with side wall interconnections is provided. The semiconductor device includes a first three-dimensional (3D) stacked die package, wherein the first 3D stacked die package includes two or more die layers that are bonded together, the first 3D stacked die package comprising a top surface, bottom surface, and one or more side walls. A first side wall of the one or more side walls includes two or more side wall pads, wherein each side wall pad of the two or more side wall pads is coupled to an interconnect of a respective die layer of the two or more die layers.

In further embodiments, a method of manufacturing a semiconductor package with side wall interconnections is provided. The method includes stacking two or more die layers, each of the two or more die layers comprising at least one side wall pad respectively. The method continues by bonding the two or more die layers to form a three-dimensional (3D) stacked die package, the 3D stacked die package comprising a top surface, bottom surface, and one or more side walls. The method further includes exposing each of the at least one side wall pad of the two or more die layers, at at least one side wall of the one or more side walls, wherein exposing each of the at least one side wall pad includes making each of the at least one side wall pads accessible from an exterior of the 3D stacked die package.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements.

However, the existence of direct bonding does not exclude other forms of bonding, in which intervening elements may be present.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

In conventional 3D stacked die semiconductor packages (also referred to interchangeably as "3D chip stacks"), vertical interconnections between the stacked dies (also referred to as die layers) of 3D stacked die packages are typically realized using TSVs, which results in larger chip footprints due to the TSV itself, as well as associated keep-out zones. Moreover, IP cores in adjacent die layers may be positioned so as to overlap and/or to be in close proximity to avoid extensive back end of the line (BEOL) interconnects, which further results in inefficient use of space and a larger package footprint.

The proposed 3D stacked die package utilizes side wall interconnections to provide interconnections between the stacked die layers (e.g., vertical interconnections), as well as interconnections to other stacked die packages. As known to those skilled in the art, a die forming a die layer of a stacked die package includes a semiconductor (e.g., silicon or other semiconductor) die on which a circuit or set of circuits (e.g., ICs) are fabricated. Side wall interconnections may be provided on one or more side walls of a 3D stacked die package. In this way, the footprint of a 3D stacked die package may be reduced, and space used more efficiently. Furthermore, additional side wall layers may be utilized, such as a RDL layer, micro bump layer, vertical interconnect fabric, or other side wall layer to provide vertical interconnection (e.g., between die layers), and interconnections to other components, such as another 3D stacked die package.

FIG. 1 is a schematic diagram of a semiconductor package 100 for side wall interconnection with side wall pads, in accordance with various embodiments. The semiconductor package 100 includes a 3D stacked die package 105 with two or more die layers 110, which further includes a first die layer 110a, second die layer 110b, and so on through an n-th die layer 110n. Each die layer 110a-110n further includes bulk silicon layer 115 and one or more BEOL layers 120, and one or more adhesive layers 125 between each of the two or more die layers 110. Each die layer 110a-110n further includes a respective IP core 130, interconnects 135, and side wall pads 140. It should be noted that the various components of semiconductor package 100 are schematically illustrated in FIG. 1, and that modifications to the various components and other arrangements of semiconductor package 100 may be possible and in accordance with the various embodiments.

In various embodiments, the semiconductor package 100 may include a 3D stacked die package 105. As depicted, the 3D stacked die package 105 may be formed in the shape of a cube or a cuboid. Thus, the 3D stacked die package 105 may include six faces (e.g., exterior surfaces): a bottom surface 145, top surface 155, and four side walls 150a-150d. In other examples, the 3D stacked die package 105 may have a different 3D shape (e.g., a polyhedral shape and corresponding number of faces, or an irregular shape). Thus, it is to be understood that in various embodiments, the shape and configuration of the 3D stacked die package 105 is not limited to any particular arrangement.

The 3D stacked die package 105 includes two or more die layers 110 that have been stacked in a vertical direction and bonded. In various examples, each die layer 110a-110n may have a planar structure in which each individual die layer is bonded to at least one adjacent die layer. In some examples, the two or more die layers 110 may be bonded via one or more adhesive layers 125. The one or more adhesive layers 125 may include, without limitation, an epoxy or thermal interface material. In yet further examples, the two or more die layers 110 may be surface bonded, for example, via oxide-oxide bonding or hybrid bonding, Cu—Cu bonding, flip chip bonding, adhesive bonding, or other suitable bonding techniques.

In some embodiments, each individual die layer may respectively include an IP core 130. As used here, an IP core 130 includes, without limitation, a discrete, reusable unit of logic or a circuit design that has a defined input/output interface and behavior. The IP core 130 may, thus, be discrete from other parts of the IC and/or semiconductor die, and reused on the same and/or different die layers of the 3D die stack package 105. Each IP core 130 may further be coupled to side wall pads 140 arranged along an edge of the respective die layer 110a-110n (and in turn the edge of the 3D die stack 105) via interconnects 135. Interconnects 135 may include, for example, conductive traces (e.g., metal, copper (Cu), etc.), conductive pads (e.g., copper pads), and/or through-hole vias (e.g., TSVs or through mold vias (TMVs)). Accordingly, interconnects 135 may include any structures connecting different circuit elements, in this case, elements of the IP core 130 (e.g., different parts of the I/O circuitry of the IP core 130) to the side wall pads 140. The interconnects 135, in some further examples, are formed in a coplanar arrangement with the respectively associated die layer 110a-110n.

In various examples, the side wall pads 140 may be a conductive structure exposed from the 3D die stack package 105 along an at least one side wall (in this example a first side wall 150a). The side wall pad 140, for example, may include, without limitation, an exposed conductive pad, exposed metal trace or wire, an exposed conductive pillar (e.g., with and/or without solder ball at the exposed end of the pillar), or an exposed TSV and/or TMV in which an internal conductive layer (e.g., metallization layer) of the TSV and/or TMV is exposed along the side wall (e.g., first side wall 150a). In various examples, the side wall pads 140 may be exposed along the at least one side wall (e.g., first side wall 150a) temporarily, for example, during a manufacturing process. Specifically, the side wall pads 140 may be exposed along the at least one side wall before the 3D die stack package 105 is bonded to an adjacently placed package element (e.g., other 3D stacked die packages, other active dies and/or passive components, etc.), RDL, or interconnection layer, as described in greater detail below with respect to FIGS. 3-5. Accordingly, in various embodiments, the side wall pads 140 are configured to allow electrical and/or physical conductivity to the two or more die layers 110 of the 3D die stack package 105 via at least one side wall 150a-150d of the 3D die stack package 105. The side wall pads 140 may include exposed conductive structures (e.g., wires, pads, pillars, TSVs, and/or other types of interconnects), where the conductive structures are, in some examples, exposed temporarily until the side wall pads 140 are bonded to an adjacently placed package element, RDL, or interconnection layer, thereby causing the side wall pads 140 to become covered.

As previously described, in some examples, the 3D die stack package 105 may be cuboid in shape, and have a total of 6 rectangular (or square) faces. In the cuboid arrangement, the 3D die stack package 105 has 4 side walls, 150a-150d, a bottom surface 145, and a top surface 155. Although FIG. 1 depicts side wall pads 140 as exposed along the first side wall 150a, it is to be understood that in other embodiments, the arrangement of side wall pads 140 may vary, and side wall pads may be found on any subset of side walls 150a-150d or all side walls 150a-150d of the 3D die stack package 105.

In various embodiments, the side wall pads 140 may be exposed through a process of grinding. For example, in some embodiments, the side wall pads 140 and interconnects 135 may be formed and/or deposited on the one or more BEOL layers 120 during the BEOL manufacturing process. Thus, the one or more BEOL layers 110b refers to one or more layers and/or components formed during the BEOL of an IC manufacturing process. Accordingly, as known to those skilled in the art, the BEOL of a manufacturing process includes the process of forming the one or more BEOL layers 110b, and may refer to a stage in the fabrication process for ICs in which contacts, such as conduct pads, wires, vias, other interconnect structures, and dielectric structures may be formed. This is in contrast with the front end of the line (FEOL) process, in which active die (e.g., transistors), and/or passive elements may be formed in silicon and/or semiconductor material. For example, passive elements may include, for example, filters and other components (e.g., resistive, capacitive, and/or inductive elements). Thus, the structure of the interconnects 135 and side wall pads 140 may be formed during as part of the one or more BEOL layers 120 during the BEOL fabrication process for the respective die layers 110a-110n.

In some examples, the side wall pads 140 may further include TSVs formed through the respective individual die layer 110a-110n and internal TSV metallization exposed during a grinding and/or cutting process. In other words, the TSV or other through hole via may be grinded so as to expose a cross-section of the TSV at the side wall (e.g., side wall 150a), thus exposing the internal metallization layer of the TSV. Accordingly, although the side wall pads 140 are depicted as conductive pads deposited on a die substrate in FIG. 1, it is to be understood that the side wall pads 140 may further include internal metallization layers of a via. In some examples, the internal metallization layer may include a copper plating and/or copper film deposited within a through-hole (e.g., TSV).

In various examples, the side wall pads 140 may be arranged and spaced at a desired pitch along the side wall. For example, individual layers may be stacked with a desired spacing, orientation, and/or positioning to create side wall pads 140 with a specific pitch (e.g., a bump pitch for micro bumps and/or Cu—Cu bonding) or positioning along the side wall. Stacking of the individual die layers may, in various examples, be performed at either the wafer-level (e.g., concurrent stacking of multiple die layers of multiple stacked 3D die packages or "cubes") and/or die level (e.g., stacking die layers of individual stacked 3D die packages).

Accordingly, once the interconnects 135 and side wall pads 140 formed for the two or more die layers 110, a side wall 150a-150d and/or side walls 150 may be ground to expose the side wall pads. Specifically, interconnects and side wall pads 140 may be formed at the individual die layer extending towards an edge of the respective die layer, but not yet exposed. Thus, after stacking and bonding of the two or more die layers 110, a side wall may be cut, grinded, and/or polished to expose the side wall pads 140 for coupling to other components. For example, exposing the side wall pads 140 may include a combination of processes, including, without limitation, saw cuts, grinding, and/or chemical-mechanical polishing (CMP). In some examples, grinding and/or CMP may utilize multiple 3D die stack packages that are reconstituted as a wafer/panel, with the side wall of interest for all 3D die stack packages forming one process surface. In this way, the side wall pads 140 may be exposed at one or more side walls. Accordingly, exposing the side wall pads 140 may include any process by which the side wall pads 140 are physically exposed to an exterior environment, or otherwise made accessible physically and/or electrically from an exterior of the 3D stacked die package 105.

Once exposed, the side wall pads 140 may be used to form a side-wall RDL or other interconnection layer, as will be described in greater detail below with respect to FIGS. 2-5.

Figure 2:
FIG. 2 is a schematic diagram of a semiconductor package for side wall interconnection with a side wall RDL layer, in accordance with various embodiments.

FIG. 2 is a schematic diagram of a semiconductor package 200 for side wall interconnection with a side wall RDL layer, in accordance with various embodiments. Specifically, the semiconductor package 200 includes a 3D stacked die package 205 with two or more die layers 210, which further includes a first die layer 210a, second die layer 210b, and so on through an n-th die layer 210n. Each die layer 210a-210n further includes respective IP core 215, interconnects 220, side wall pads 225, and RDL 230. It should be noted that the various components of semiconductor package 200 are schematically illustrated in FIG. 2, and that modifications to the various components and other arrangements of semiconductor package 200 may be possible and in accordance with the various embodiments.

Like the 3D stacked die package 105 of FIG. 1, side wall pads 225 may be exposed along one side wall of the 3D stacked die package 205. In various embodiments, the RDL 230, and more specifically the interconnects of the RDL 230, may further be bonded to the side wall pads 225. A RDL refers to the metal (or other conductive material) interconnects that electrically and/or physically couple one part of a semiconductor package to another (e.g., interconnects between different components of a semiconductor package), and further provides conductive pads at other locations to allow I/O interfacing at other locations of the semiconductor package. Thus, RDLs may include copper pads, wiring, and traces. RDLs may further include one or more layers through which interconnections may be present. In contrast with typical RDLs, which are coplanar with the die and/or substrate of the die, various embodiments of the 3D stacked die package 205 provide for one or more layers of RDL 230 that are formed along a side wall, in an orientation that is orthogonal to the typical arrangement of a RDL.

In some embodiments, the RDL 230 may include one or more layers. The one or more layers of RDL 230 may be formed, using traditional wafer level packaging processes.

For example, in some embodiments, the one or more layers of RDL 230 may be formed from a plurality of dielectric layers, and from material such as, without limitation, polyimides (PI), polybenzoxazoles (PBO), and/or mold compounds (e.g., epoxy). Thus, using wafer level RDL-like processes, by reconstituting the 3D stacked die package 205 sideways, side wall RDLs may be realized on all side walls. In further embodiments, side wall RDLs may be formed, with or without RDLs on the top and bottom surfaces of the 3D stacked die package 205.

In this way, RDLs formed on a side wall provide vertical interconnection between the individual die layers 210a-210n in the 3D stacked die package 205. In some examples, this eliminates the use of TSVs or other vertical vias fanned out in the region outside of the die boundary, reducing overall footprint of the 3D stacked die package 205.

In various examples, the interconnects of the RDL 230 may be bonded to the side wall pads 225. For example, in some embodiments, the interconnects of the RDL 230 are copper-bonded (Cu—Cu bonding), for example, via hybrid copper bonding (HCB) and/or direct copper bonding (DCB) to the side wall pads 225 of the 3D stacked die package 205. In further embodiments, the RDL 230 is formed directly on the side wall via a copper plating process. In yet further embodiments, the interconnects of the RDL 230 may be bonded via solder bumps (e.g., uBumps, Cu bumps, etc.) formed by the side walls pads 225.

While FIG. 2 depicts RDL 230 as being formed on one side wall of the 3D stacked die package 205, it is to be understood that in other embodiments, placement of the RDL is not limited to any particular side wall. Furthermore, in other examples, a RDL may be formed on a subset of side walls and/or all side walls of the 3D stacked die package 205.

In various embodiments, the bumps and/or pads may be provided on the side wall via an additional interconnection layer. In some examples, the additional interconnection layer may be coupled to the side wall RDL 230. The formation of the interconnection layer is described below with reference to FIG. 3.

Figure 3:
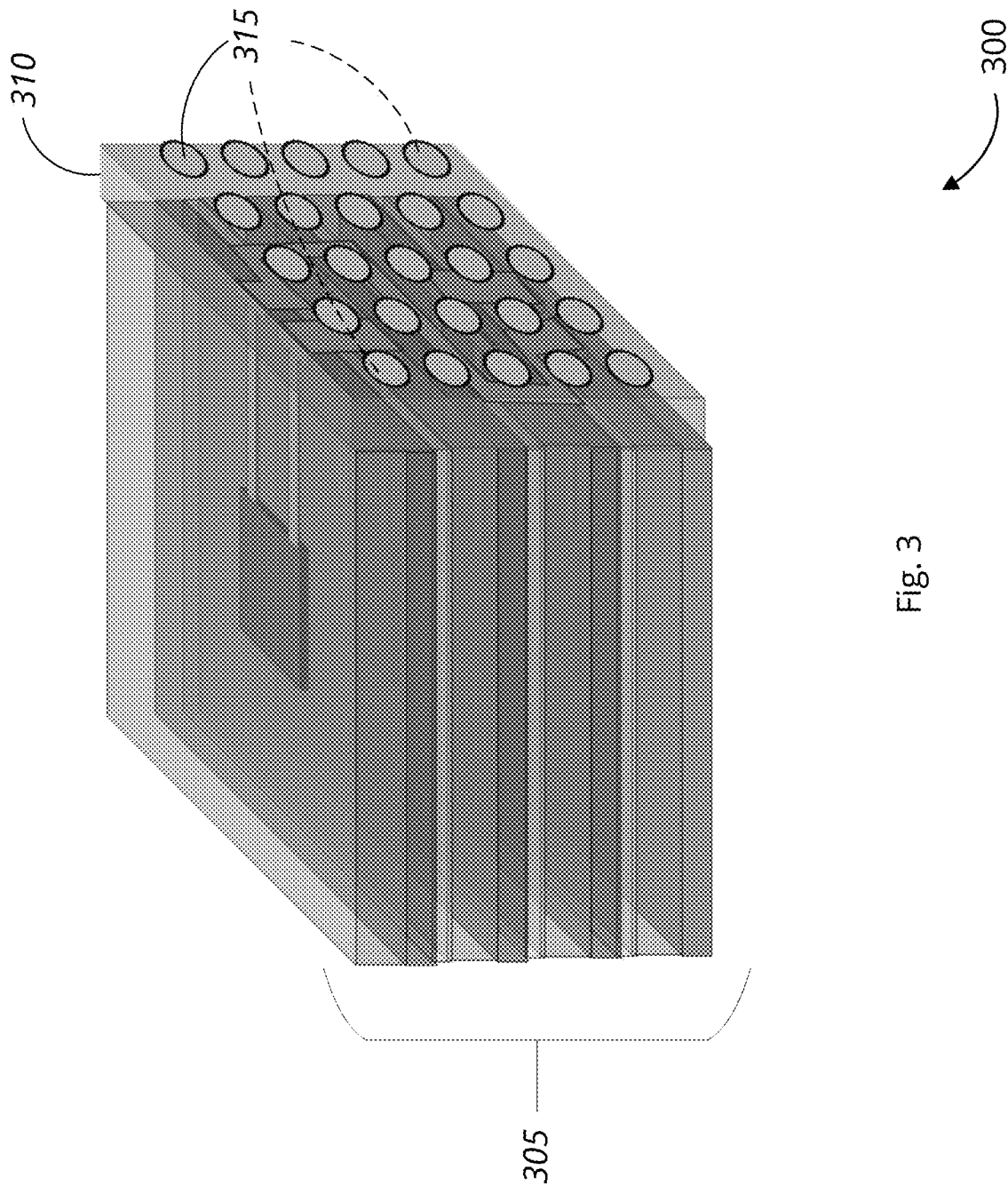
FIG. 3 is a schematic diagram of a semiconductor package for side wall interconnection with an additional interconnection layer, in accordance with various embodiments.

FIG. 3 is a schematic diagram of a semiconductor package 300 for side wall interconnection with an additional interconnection layer, in accordance with various embodiments. Like the semiconductor packages 100, 200 of FIGS. 1 & 2, the semiconductor package 300 includes a 3D stacked die package 305 with two or more die layers, and one or more layers of a RDL formed and/or coupled to a side wall of the 3D stacked die package 305. The semiconductor package 300 further includes an interconnection layer 310, which further includes an array of bumps 315. It should be noted that the various components of semiconductor package 300 are schematically illustrated in FIG. 3, and that modifications to the various components and other arrangements of semiconductor package 300 may be possible and in accordance with the various embodiments.

In various embodiments, a 3D stacked die package 305 may further include an additional interconnection layer 310. For example, a 3D stacked die package 305, with or without a side wall RDL as described with respect to FIG. 2, may further include an interconnection layer 310 configured to provide one or more bumps and/or conductive pads. In some examples, the interconnection layer 310 is configured to allow additional 3D stacked die packages to be coupled to the 3D stacked die package 305 along respective side walls of the 3D stacked die packages. In some examples, interconnection layer 310 may be bumped and assembled on a side wall of the 3D stacked die package 305. The interconnection layer 310 may be coupled to a side wall of a 3D stacked die package, such as stacked die package 305, using techniques such as, without limitation, laser assisted bonding (LAB), Cu—Cu bonding (such as HCB and/or DCB), or using solder bumps.

In some examples, the interconnection layer 310 includes an array of bumps 315. In some embodiments, the array of bumps 315 may include dedicated bumps for testing and/or probing purposes. In yet further embodiments, the array of bumps 315 may include bumps for coupling to a side wall RDL layer and/or side wall pads of another 3D stacked die package, another active die package, or passive die/passive circuit elements. In some examples, the array of bumps 315 may be formed on the interconnection layer using a copper plating process and/or micro bumping process (e.g., solder plating). As used herein, bumps and/or micro bumps may refer to solder micro bumps. Micro bumps, for example, may include copper pillars (CuP) having solder tips and/or solder caps. While the array of bumps 315 are depicted as having a regular grid-like pattern for purposes of explanation, it is to be understood in other embodiments, the bumps may be formed in an irregular pattern, spacing, or shape.

Figure 4:
FIG. 4 is a schematic diagram of a semiconductor package with two bonded 3D chip stacks coupled via side wall, in accordance with various embodiments.
Figure 4:
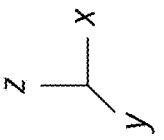

FIG. 4 is a schematic diagram of a semiconductor package 400 with two bonded 3D chip stacks coupled via side wall, in accordance with various embodiments. The semiconductor package 400 includes a first 3D stacked die package 405, second 3D stacked die package 410, and interconnection layer 415. It should be noted that the various components of semiconductor package 400 are schematically illustrated in FIG. 4, and that modifications to the various components and other arrangements of semiconductor package 400 may be possible and in accordance with the various embodiments.

As previously described with respect to FIG. 3, the interconnection layer 415 may be configured to couple the first 3D stacked die package 405 to the second 3D stacked die package 410. In some examples, the first 3D stacked die package 405 includes a different arrangement of side wall pads from the second 3D stacked die package 410. For example, the first 3D stacked die package 405 includes side wall pads on a first side wall, whereas the second 3D stacked die may include side wall pads on two side walls, a first side wall and a second side wall. According to some examples, the interconnection layer 415 may be configured to couple the first side wall of the first 3D stacked die package 405 to the first side wall of the second 3D stacked die package 410. In some examples, the first side wall of the first 3D stacked die package 405 may further include a side wall RDL. Accordingly, in some examples, the array of bumps of the interconnection layer 415 may be configured to couple the side wall pads of the first side wall of the second 3D stacked die package 410 to one or more layers of the side wall RDL of the first 3D stacked die package.

It is to be appreciated that in other arrangements of connected package elements (e.g., other 3D stacked die packages, other active dies and/or passive components, etc.), the interconnection layer 415 may include different arrangements of bumps and/or pads to appropriately couple signals between adjacent elements coupled by the interconnection layer 415. In some further examples, the interconnection layer 415 may be configured to provide structural rigidity and/or mechanical support to the coupled package elements. In yet further examples, other structures may be employed to couple package elements in an x-y direction (e.g., along side walls), as well as in a vertical z-direction, along a top and/or bottom surface(s) of 3D stacked die package(s).

Figure 5:
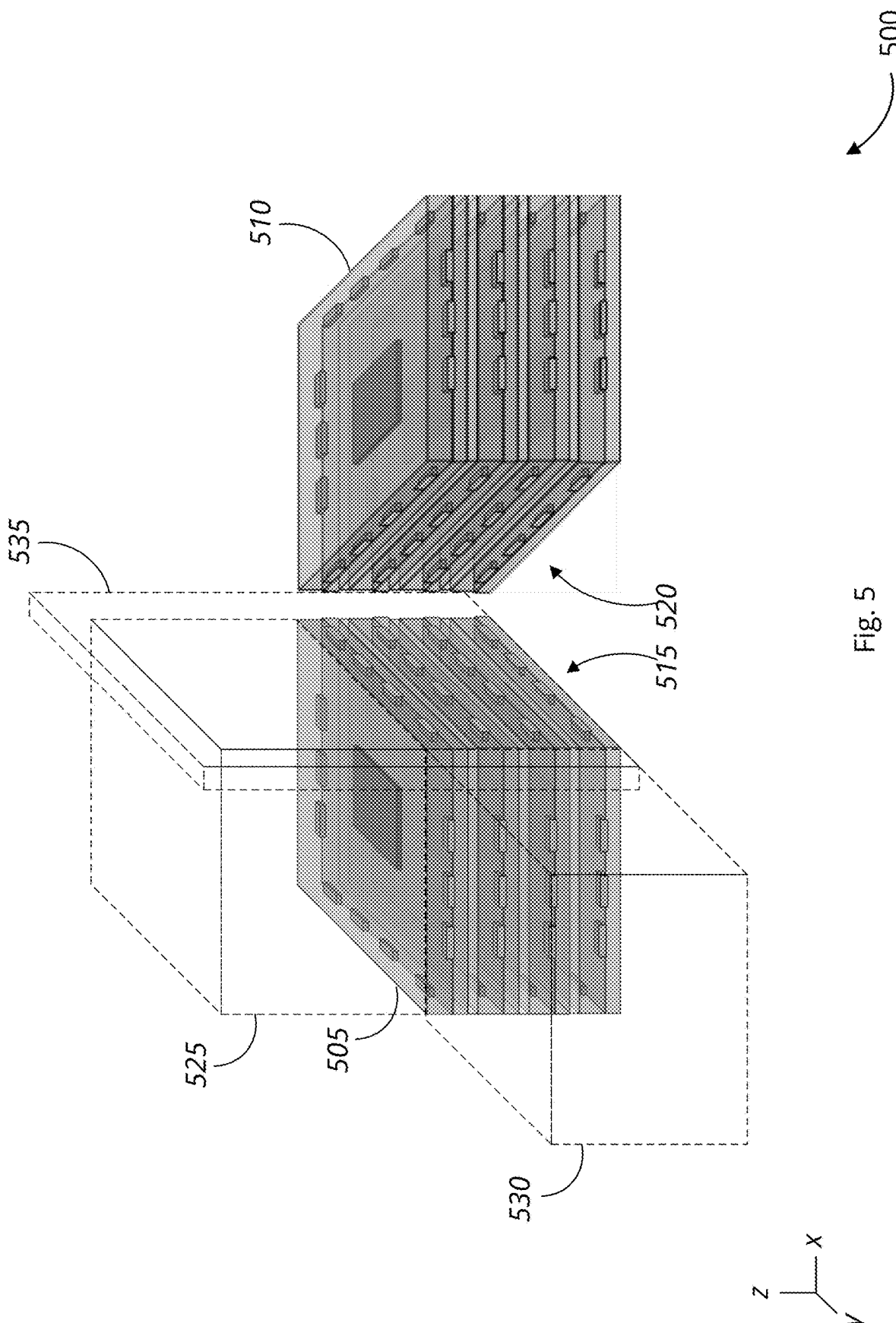
FIG. 5 is a schematic diagram of an alternative arrangement for bonding of 3D chip stacks using side wall interconnections, in accordance with various embodiments.

FIG. 5 illustrates examples of such arrangements. FIG. 5 is a schematic diagram of an alternative arrangement for bonding of 3D chip stacks using side wall interconnections in a semiconductor package 500, in accordance with various embodiments. The semiconductor package 500 includes a first 3D stacked die package 505 including side wall pads 515, second 3D stacked die package 510 including side wall pads 520, a vertically coupled package element 525, laterally coupled package element 530, and interconnection layer 535. It should be noted that the various components of semiconductor package 500 are schematically illustrated in FIG. 5, and that modifications to the various components and other arrangements of semiconductor package 500 may be possible and in accordance with the various embodiments.

In contrast with the arrangement of semiconductor package 400 of FIG. 4, semiconductor package 500 includes additional package elements coupled to the first 3D stacked die package 505. Specifically, a vertically coupled package element 525 is coupled to a top surface of the first 3D stacked die package 505, and a laterally coupled package element 530 is coupled to a second side wall of the first 3D stacked die package 505.

In various examples, the vertically coupled package element 525 and laterally coupled element 530 may include, without limitation, additional 3D stacked die packages, active die or other active circuit elements, and/or passive die or other passive components. In some examples, the first 3D stacked die package 505 may be communicatively coupled (e.g., electrically) to one or more of the second 3D stacked die package 510, vertically coupled package element 525, or the laterally coupled package element 530, via side wall pads 515. In some examples, the interconnection layer 535 may further be configured to couple the side wall pads 515 to the other package elements.

In some examples, the vertically coupled package element 525 may be coupled to the first 3D stacked die package 505 via surface bonding (e.g., oxide-oxide bonding), Cu—Cu bonding, adhesive (e.g., epoxy), and/or flip-chip bonding techniques. In yet further embodiments, the vertically coupled package element 525 may be coupled to the side wall pads 515 of the first 3D stacked die package 505 via a side wall RDL of the first 3D stacked die package 505.

Like the first 3D stacked die package 505, the second 3D stacked die package 510 may include side wall pads 520 through which the second 3D stacked die package 510 is coupled to other package elements. Each of the first and second 3D stacked die packages 505, 510 may include side wall RDLs and/or RDLs at a top surface or bottom surface.

In FIG. 4, interconnection layer 415 is coextensive with the side walls of the 3D stacked die packages. In contrast, interconnection layer 535 of FIG. 5 may extend beyond the side walls of the first and second 3D stacked die packages 505, 510 to accommodate coupling to additional package elements vertically in the z-direction, and laterally in the x-y directions. In some examples, the interconnection layer 535 includes a vertical interconnect fabric. The interconnect fabric may include, in some examples, a conductive fabric and/or conductive traces configured to be inserted at the side wall interfaces (e.g., between side wall pads 515, 520, such that semiconductor package 500 can be scaled vertically (e.g., in the z-direction), as well as laterally in one direction (e.g., in one of an x-direction or y-direction)). In yet further embodiments, the interconnection layer 535 may include a structure as previously described with respect to FIG. 4, but extending beyond the side walls of at least one of the first 3D stacked die package 505 and/or second 3D stacked die package 510.

In further embodiments, the first 3D stacked die package 505 and/or second 3D stacked die package 510 may be coupled via side wall pads 515, 520 using a micro-bumps with solder caps and LAB processes to bond bumps on the respective side walls. In yet further examples, side wall pads 515, 520 may be coupled to other package elements via Cu—Cu bonding, such as HCB and/or DCB.

FIG. 6 is a flow diagram of a method 600 of manufacturing a 3D chip stack with side wall interconnection. The method 600 includes, at block 605, forming two or more die layers, each die layer including at least one respective side wall pad. As previously described, each die layer may include respective IP cores, and interconnects extending outwards towards the edge of a die (e.g., die layer). The interconnects may include conductive wires, traces, pads, and/or vias formed during a BEOL process. The interconnects may be deposited or otherwise formed as part of the die or on a die substrate. The interconnects may be configured to couple the die and/or IP core to other components. In some examples, the side wall pads may, accordingly, include all or part of the interconnects of the respective die layers of a 3D stacked die package. The side wall pads may, in some examples, include pads and/or vias formed at the edge of the package. In other examples, the side wall pads may be conductive wire and/or traces, extending towards the edge of the die, and later exposed at the side wall. Through hole vias, such as TSVs or TMVs may similarly be formed towards an edge of the die (or molding in the case of TMVs).

The method 600 continues, at block 610, by stacking the two or more die layers. As previously described, the two or more die layers may be stacked in a vertical direction. In some examples, the two or more die layers may be arranged with a spacing, orientation, and/or in a sequence (e.g., a sequence of two or more die layer designs) so as to produce an arrangement of side wall pads. For example, the two or more die layers may be stacked to create side wall pads having a specific pitch and/or positioning. Stacking of the two or more die layers may, in various examples, be performed at either the wafer-level (e.g., concurrent stacking of multiple die layers of multiple stacked 3D die packages or "cubes") and/or die level (e.g., stacking die layers of individual stacked 3D die packages).

The method 600 continues, at block 615, by bonding the stack of two or more die layers to form a 3D stacked die package. Suitable bonding techniques may include surface bonding (e.g., oxide-oxide bonding, hybrid bonding), Cu—Cu bonding, flip chip bonding, adhesive bonding, or other suitable bonding techniques.

The method 600 may further include, at block 620, exposing respective side wall pads of the two or more die layers at a side wall of the 3D stacked die package. As previously described, the side wall pads of the two or more die layers may be exposed through a process of cutting, grinding, and/or polishing. In some embodiments, the side wall pads may be exposed at a side wall through a combination of processes, including, without limitation, saw cuts, grinding, and/or CMP. In some examples, grinding and/or CMP may be performed on the wafer level, with the side wall of interest for all 3D die stack packages forming one process surface of the reconstituted wafer/panel. Accordingly, exposing the side wall pads may include a process by which the side wall pads are physically exposed to an exterior environment, or otherwise made accessible physically and/or electrically from an exterior of the 3D stacked die package.

In some examples, the method 600 continues, at block 625, forming one or more layers of RDL at the side wall. As previously described, a RDL may be formed at the side wall, coupling two or more layers of the 3D stacked die package. In some examples, the RDL may include one or more layers formed at the side wall. The RDL may be formed using traditional wafer level packaging processes. For example, in some embodiments, the one or more layers of RDL may be formed from a plurality of dielectric layers, and from material such as, without limitation, PI, PBO, and/or mold compounds. Thus, by reconstituting the 3D stacked die package sideways (e.g., laterally), side wall RDLs may be realized on all side walls. In further embodiments, side wall RDLs may be formed, with or without RDLs on the top and bottom surfaces of the 3D stacked die package. In some examples, the interconnects (e.g., pads, wiring, traces, etc.) of the side wall RDL may further be coupled to the side wall pads. In some examples, the interconnects of the RDL may be coupled to the side wall pads via solder bonding/micro bumps (e.g., solder micro bumps, copper post with solder tip, etc.), Cu—Cu bonding (including HCB and/or DCB), and/or a Cu plating process.

At block 630, the method 600 continues by forming an additional interconnection layer at the side wall. In some examples, the interconnection layer is configured to allow additional 3D stacked die packages to be coupled to the 3D stacked die package along respective side walls of the 3D stacked die packages. In some examples, interconnection layer may comprise an array of bumps and/or pads arranged on a side wall of the 3D stacked die package. In some examples, the interconnection layer may be coupled to the side wall pads via LAB of solder bumps/micro bumps and/or Cu—Cu bonding (including HCB and/or DCB). In various examples, the interconnection layer includes an array of bumps for connection to other package elements. In some embodiments, the array of bumps (or pads) may include bumps and/or pads dedicated for testing and/or probing purposes. In yet further embodiments, the array of bumps (or pads) may be configured to be coupled to a side wall RDL layer and/or side wall pads of another 3D stacked die package, another active die package, or passive die/passive circuit components. In some examples, the array of bumps (or pads) may be formed on the interconnection layer using a copper plating process (e.g., electrochemical deposition) and/or micro bumping process (e.g., solder plating).

At block 640, the method 600 includes bonding a package element to the 3D stacked die package. As previously described, package elements may include other 3D stacked die packages, active dies, passive dies, and/or passive components. Bonding the package element to the 3D stacked die package may include coupling the package element to the 3D stacked die package via a side wall of the 3D stacked die package. In some examples, the package element may be coupled to the side wall of the 3D stacked die package directly via one or more side wall pads through micro bumps/solder cap, or a Cu—Cu bonding process. In further examples, the package element may be coupled to the side wall via a RDL layer and/or interconnection layer as previously described. The interconnection layer, in some embodiments, includes an interconnection fabric inserted at a side wall interface to extend connections vertically (in the z-direction) or laterally (in one of an x-direction or y-direction).

The techniques and processes described above with respect to various embodiments may be used to manufacture semiconductor packages 100, 200, 300, 400, and 500, and/or components thereof, as described herein.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. An apparatus comprising:

two or more die layers that are bonded together, the two or more die layers comprising a top surface, bottom surface, and one or more side walls, wherein a first side wall of the one or more side walls comprises two or more side wall pads, wherein each side wall pad of the two or more side wall pads is coupled to an interconnect of a respective die layer of the two or more die layers.

2. The apparatus of claim 1, further comprising a redistribution layer (RDL) formed on at least one of the one or more side walls, the RDL bonded to at least two of the two or more side wall pads, the RDL electrically coupling respective side wall pads from at least two different die layers of the two or more die layers.

3. The apparatus of claim 2, wherein the RDL is coupled to at least two side walls, wherein the one or more side walls include at least two side walls.

4. The apparatus of claim 2, wherein the RDL includes two or more layers.

5. The apparatus of claim 1, wherein the one or more side walls include at least two side walls, wherein the at least two side walls include two or more side wall pads respectively.

6. The apparatus of claim 1, wherein the two or more side wall pads include at least one of exposed metal wire, conductive trace, or a metal pad.

7. The apparatus of claim 1, wherein the two or more side wall pads include an internal metallization layer of a through hole via.

8. The apparatus of claim 1, further comprising an interconnection layer coupled to at least one of the one or more side walls, the interconnection layer comprising a plurality of micro bumps, the interconnection layer configured to electrically couple the two or more side wall pads to the plurality of micro bumps.

9. A semiconductor device comprising:

a first three-dimensional (3D) stacked die package, wherein the first 3D stacked die package includes two or more die layers that are bonded together, the first 3D stacked die package comprising a top surface, bottom surface, and one or more side walls, wherein a first side wall of the one or more side walls comprises two or more side wall pads, wherein each side wall pad of the two or more side wall pads is coupled to an interconnect of a respective die layer of the two or more die layers.

10. The semiconductor device of claim 9, further comprising a redistribution layer (RDL) formed on at least one of the one or more side walls, the RDL bonded to at least two of the two or more side wall pads, the redistribution layer electrically coupling respective side wall pads from at least two different die layers of the two or more die layers.

11. The semiconductor device of claim 10, wherein the RDL is coupled to at least two side walls, wherein the one or more side walls include at least two side walls.

12. The semiconductor device of claim 10, wherein the RDL is one of direct copper bonded or hybrid copper bonded to the at least two of the two or more side wall pads.

13. The semiconductor device of claim 10, wherein the RDL includes two or more layers.

14. The semiconductor device of claim 9, further comprising a second 3D stacked die package, wherein the second 3D stacked die package is coupled to the first 3D stacked die package via at least one of the one or more side walls.

15. The semiconductor device of claim 9, wherein the one or more side walls include at least two side walls, wherein the at least two side walls include two or more side wall pads respectively.

16. The semiconductor device of claim 9, wherein the two or more side wall pads include at least one of exposed metal wire, conductive trace, or a metal pad.

17. The semiconductor device of claim 9, wherein the two or more side wall pads include an internal metallization layer of a through silicon via.

18. The semiconductor device of claim 9, further comprising an interconnection layer coupled to at least one of the one or more side walls, the interconnection layer comprising a plurality of micro bumps, the interconnection layer configured to electrically couple the two or more side wall pads to the plurality of micro bumps.

19. A method comprising:

stacking two or more die layers, each of the two or more die layers comprising at least one side wall pad respectively;

bonding the two or more die layers to form a three-dimensional (3D) stacked die package, the 3D stacked die package comprising a top surface, bottom surface, and one or more side walls; and exposing each of the at least one side wall pad of the two or more die layers, at at least one side wall of the one or more side walls, wherein the exposing each of the at least one side wall pad includes making each of the at least one side wall pads accessible from an exterior of the 3D stacked die package.

20. The method of claim 19, further comprising:

forming, via copper plating, a redistribution layer on the at least one side wall, wherein the redistribution layer is further electrically coupled to at least two side wall pads of the at least one side wall.

* * * * *